(12) United States Patent
Holderer et al.

(10) Patent No.: US 8,456,615 B2
(45) Date of Patent: Jun. 4, 2013

(54) OPTICAL SYSTEM HAVING HEAT DISSIPATION ARRANGEMENT

(75) Inventors: Hubert Holderer, Oberkochen (DE); Johannes Lippert, Buch am Wald (DE); Armin Schoeppach, Aalen (DE)

(73) Assignee: Carl Zeiss Laser Optics GmbH, Oberkochen (DE)

( * ) Notice: Subject to any disclaimer, the term of this patent is extended or adjusted under 35 U.S.C. 154(b) by 370 days.

(21) Appl. No.: 12/838,149

(22) Filed: Jul. 16, 2010

(65) Prior Publication Data

US 2011/0025992 A1 Feb. 3, 2011

(30) Foreign Application Priority Data

Jul. 31, 2009 (DE) .................. 10 2009 035 788

(51) Int. Cl.
*G03B 27/54* (2006.01)
*G02B 7/02* (2006.01)

(52) U.S. Cl.
USPC ............................. 355/67; 359/819; 359/820

(58) Field of Classification Search
None
See application file for complete search history.

(56) References Cited

U.S. PATENT DOCUMENTS

| 6,768,600 | B2 * | 7/2004 | Dieker ......................... 359/820 |
| 7,079,331 | B2 | 7/2006 | Weber et al. |
| 2004/0051984 | A1 | 3/2004 | Oshino et al. |
| 2004/0207825 | A1 * | 10/2004 | Wagner et al. ................. 355/30 |
| 2004/0227913 | A1 | 11/2004 | Kino |
| 2004/0262541 | A1 | 12/2004 | Honda et al. |

FOREIGN PATENT DOCUMENTS

| DE | 102 10 893 | 9/2003 |
| EP | 1 522 892 | 4/2005 |
| EP | 1 533 832 | 5/2005 |
| WO | WO 2005/109104 | 1/2005 |
| WO | WO 2006/128613 | 12/2006 |

\* cited by examiner

*Primary Examiner* — Peter B Kim
*Assistant Examiner* — Michelle Iacoletti
(74) *Attorney, Agent, or Firm* — Fish & Richardson P.C.

(57) ABSTRACT

An optical system, such as an illumination system, includes an optical arrangement having at least one optical element and at least one heat dissipation element configured to at least partially dissipate thermal energy generated in the optical element(s) to the outside environment of the optical system. The heat dissipation element(s) is(are) arranged without direct contact with the optical element(s).

28 Claims, 5 Drawing Sheets

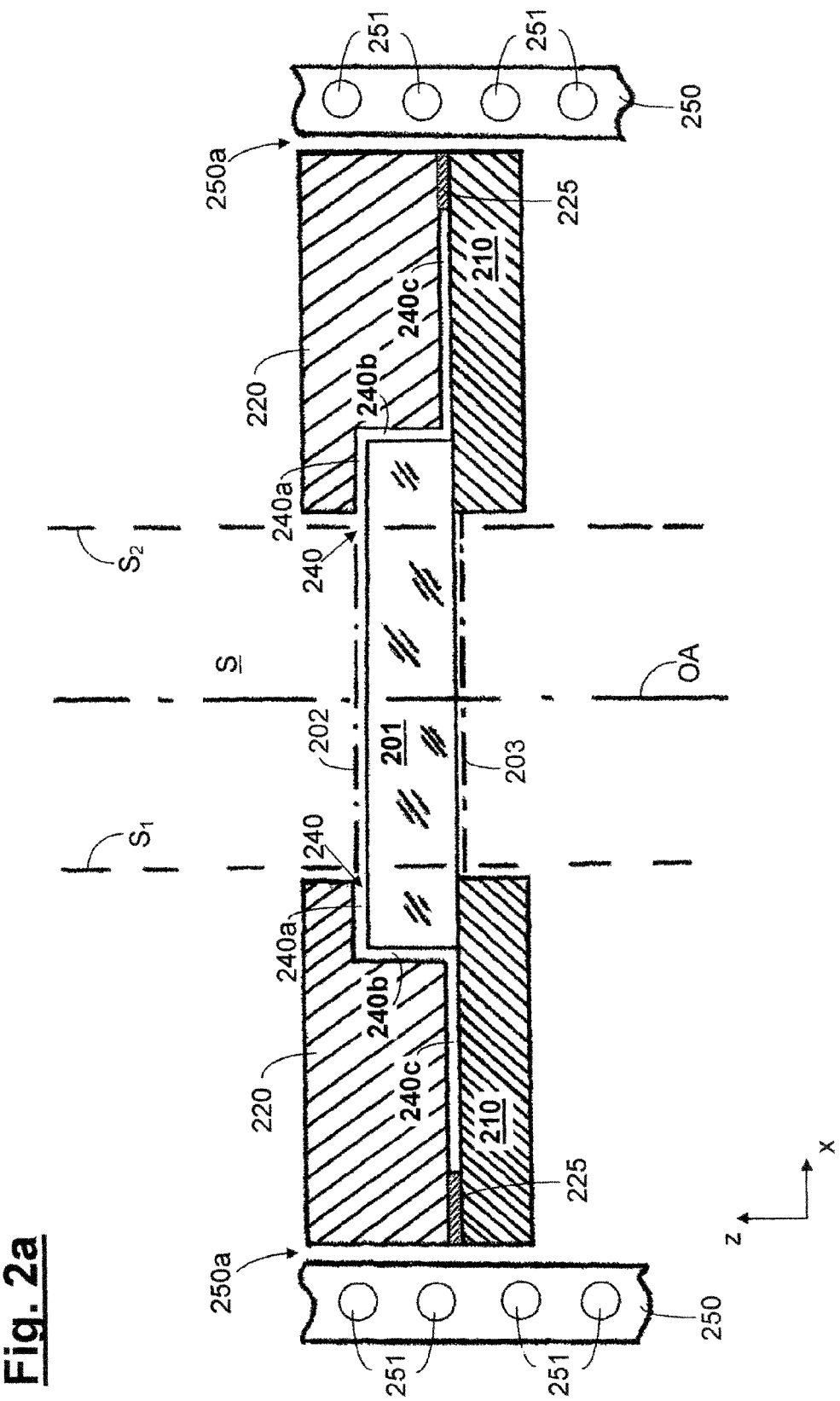

OPTICAL SYSTEM HAVING HEAT DISSIPATION ARRANGEMENT

CROSS-REFERENCE TO RELATED APPLICATION

This application claims benefit under 35 U.S.C. §119 to German patent application serial number 10 2009 035 788.2, filed Jul. 31, 2009, the entire contents of which are incorporated herein by reference.

FIELD

The disclosure relates to an optical system, such as an illumination system, having an optical arrangement.

BACKGROUND

In operation of optical systems with a globally or locally high level of luminous power density, a problem which arises is that the increase in temperature in the optical elements, such as, for example, lenses and the associated holder elements, that is linked to the high level of luminous power density and absorption for example at layers, leads to expansion or deformation phenomena with respect to the elements and/or convection flows in existing intermediate spaces, which in turn results in the imaging properties being adversely affected.

In addition, at high levels of luminous power adverse effects on the illumination or imaging process occur to an increased degree due to stray light which for example has an influence on the imaging properties that can no longer be disregarded, such as, for example, at a diffractive optical element as is used for instance in a microlithographic projection exposure apparatus.

WO 2006/128613 A1 discloses inter alia a projection objective of a microlithographic projection exposure apparatus which has at least three subsystems as well as a beam deflection device arranged between the first and second subsystems. At least one screen is provided in the region of the beam deflection device to reduce direct transfer of stray light from the first subsystem into the third subsystem.

DE 102 10 893 A1 discloses inter alia an optical arrangement having an optical component which is disposed in a housing, in particular an aperture member. The component has an optically active first region and an optically inactive second region which at least partially surrounds the first region. Connected to the optically inactive second region is a thermally conductive element to dissipate heat from the housing to a heat radiating body in order to reduce a thermal drift of the characteristic of the optical system that is linked to an increase in temperature of the aperture member.

WO 2005/109104 A2 discloses inter alia an optical component having an optically active element and a holding element which is heat-conductingly connected thereto. The holding element has an active cooling system for dissipating heat from the optical element.

SUMMARY

The disclosure provides an optical system, such as an illumination system, having an optical arrangement configured to effectively dissipate heat present in the optical system when the optical system is operating at high luminous power densities.

In some embodiments, an optical arrangement in an optical system, such as an illumination system, includes at least one optical element and at least one heat dissipation element to at least partially dissipate thermal energy generated in the optical element to the outside environment of the optical system. The heat dissipation element is arranged without direct contact with the optical element.

The fact that in the optical arrangement according to the disclosure the heat dissipation element does not have direct or immediate contact with the optical element means that particularly effective cooling is effected for example by an active cooling device having a circulating cooling medium without mechanical vibrations being transmitted from the movement of the cooling medium to the optical system and thereby exciting the optical elements such as for example lenses in turn to involve mechanical vibrations. The disclosure, however, is not limited to the presence of a cooling device having a circulating cooling medium but basically also includes arrangements in which the heat which is transmitted outwardly by the heat dissipation element is dissipated to the outside environment, for example by way of cooling ribs on the optical system, by way of convection or thermal radiation or also in any other suitable fashion.

In some embodiments, the optical element is held by at least one holder element, wherein the heat dissipation element is arranged in direct contact only with the holder element. In that way on the one hand in turn effective cooling can be effected by an active cooling device with a circulating cooling medium without mechanical vibrations being transmitted from the movement of the cooling medium to the holder element. On the other hand, heat dissipation can also be effected in relation to holder elements with respect to which for example integration—which is otherwise alternatively considered—of cooling passages into the holder element itself cannot be readily implemented as a consequence of the presence of openings or slots in the holder element (for example for solid-body joints or manipulators).

In certain embodiments, the holder element has a first region and a second region, wherein the second region is arranged in a radial direction outside the first region in relation to an optical axis of the optical system and wherein the heat dissipation element is in contact with the holder element only in the second region. This arrangement has the advantage that stress decoupling can be effected between the (radially inward) first region and the (radially outward) second region, wherein the stress decoupling is then not impeded by the contact region, in the radially outward second region, with the heat dissipation element. In other words, in this arrangement a region disposed radially outside the fitment region of manipulators or solid-body joints is utilized for fixing the heat dissipation element to the holder element.

In some embodiments, the heat dissipation element has a light passage opening, the area of which is not more than 200% (e.g., not more than 120%, not more than 105%) of the cross-sectional area of a light beam passing through the optical element in operation of the optical system. In other words, the heat dissipation element preferably just permits the light to pass through, without leaving an unused intermediate space of any size worth mentioning relative to the light beam. In that way heat conduction can occur by way of the largest possible area (remaining having regard to the requirement for the light to pass through) of the heat dissipation element and the material of the heat dissipation element can be put to optimum use.

In some embodiments, heat conduction from the optical element and/or from the holder element to the heat dissipation element is effected at least region-wise in a direction which extends at least approximately perpendicularly to the surface of the optical element and/or the holder element. As in that direction the cross-sectional areas of the optical elements (such as lenses) or the associated holder elements are generally relatively large, that also affords the greatest possible utilization of the area or material of the heat dissipation element for heat conduction. In addition the holder element and the heat dissipation element can be indented into each other in order to increase the overall area contributing to the heat transfer effect.

In certain embodiments, the heat dissipation element is arranged outside the optically used region of the optical system.

In some embodiments, the heat dissipation element is of a geometry which permits undisturbed passage of light of a light source through the optical system.

In certain embodiments, at least two heat dissipation elements are provided. The heat dissipation elements can be arranged in particular on mutually opposite sides of a holder element. Such an arrangement can be particularly effective or appropriate if the holder element has heat barriers in the form of openings or slots for example for the purposes of the fitment of solid-body joints or manipulators.

In some embodiments, the heat dissipation element is made from a material which is of a specific thermal conductivity of at least 50 W/K·m. A suitable material is in particular aluminum which is advantageous in particular when the optical system is also constructed from aluminum materials and it is thus possible to provide for adaptation of the respective coefficients of thermal expansion as well as avoiding the introduction of mechanical stresses. The use of other materials involving good thermal conductivity such as for example copper is also possible.

In certain embodiments, the heat dissipation element is arranged at least region-wise at a spacing relative to the optical element and/or the holder element which is not more than 2 mm (e.g., not more than 0.5 mm, not more than 0.1 mm), and optionally is substantially constant, such as, for example, up to ±10%, such as ±5%.

In some embodiments, the heat dissipation element is of a geometry corresponding to the optical element and/or the holder element so that heat conduction according to the disclosure can be effected making the greatest possible use of or involvement of the available area or the material of the heat dissipation element. The heat dissipation element can be in particular at least region-wise in the form of a plate or a sheet. The holder element and/or the optical element can also be contactlessly indented with each other or can have mutually corresponding surfaces with successive relative raised portions and depressions.

In certain embodiments, the holder element is at least region provided with a highly reflecting layer (HR layer) to avoid additional heating of the holder element by stray light.

In some embodiments, the heat dissipation element is at least region-wise provided with an absorbing layer (AR layer) to targetedly capture stray light by absorption and also to dissipate the heat generated thereby outwardly in a particularly effective fashion.

In certain embodiments, the heat dissipation element has light of a light source passing therethrough, wherein the light source is a laser of an energy of at least 300 watts (e.g., at least 800 watts, at least 1200 watts).

The holder element can have at least one heat barrier, such as a slot. In addition the holder element can have at least one solid-body joint or a manipulator.

In some embodiments, the optical system having the arrangement according to the disclosure is an illumination system for the homogenization of laser light over the beam cross-section.

The disclosure also provides to an optical arrangement in an optical system, such as an illumination system, that includes at least one optical element held by at least one holder element. The optical arrangement also includes at least one heat dissipation element to at least partially dissipate thermal energy generated in the optical element to the outside environment of the optical system. The heat dissipation element is arranged without direct contact with the optical element, and in direct contact only with the holder element. The holder element has at least one heat barrier. The heat dissipation element extends over the region of the heat barrier.

The disclosure can generally be advantageously used in apparatuses for and methods of laser material processing, for example for laser crystallization (e.g., in the ELA methods, SLS methods, TDX methods and ZMR methods which have long been known in the literature) and in apparatuses for and methods of laser doping (e.g., activation of dopants in semiconductors), for laser hardening, laser cutting, laser welding and so forth.

The disclosure thus further concerns an apparatus for laser material processing, in particular for laser crystallization, wherein the apparatus has an optical arrangement having the above-described features.

BRIEF DESCRIPTION OF THE DRAWINGS

Further configurations of the disclosure are to be found in the description and the appendant claims. The disclosure is described in greater detail hereinafter by embodiments by way of example illustrated in the accompanying drawings in which:

FIGS. 2a-b are diagrammatic views describing further embodiments of the disclosure;

DETAILED DESCRIPTION

Figure 1:
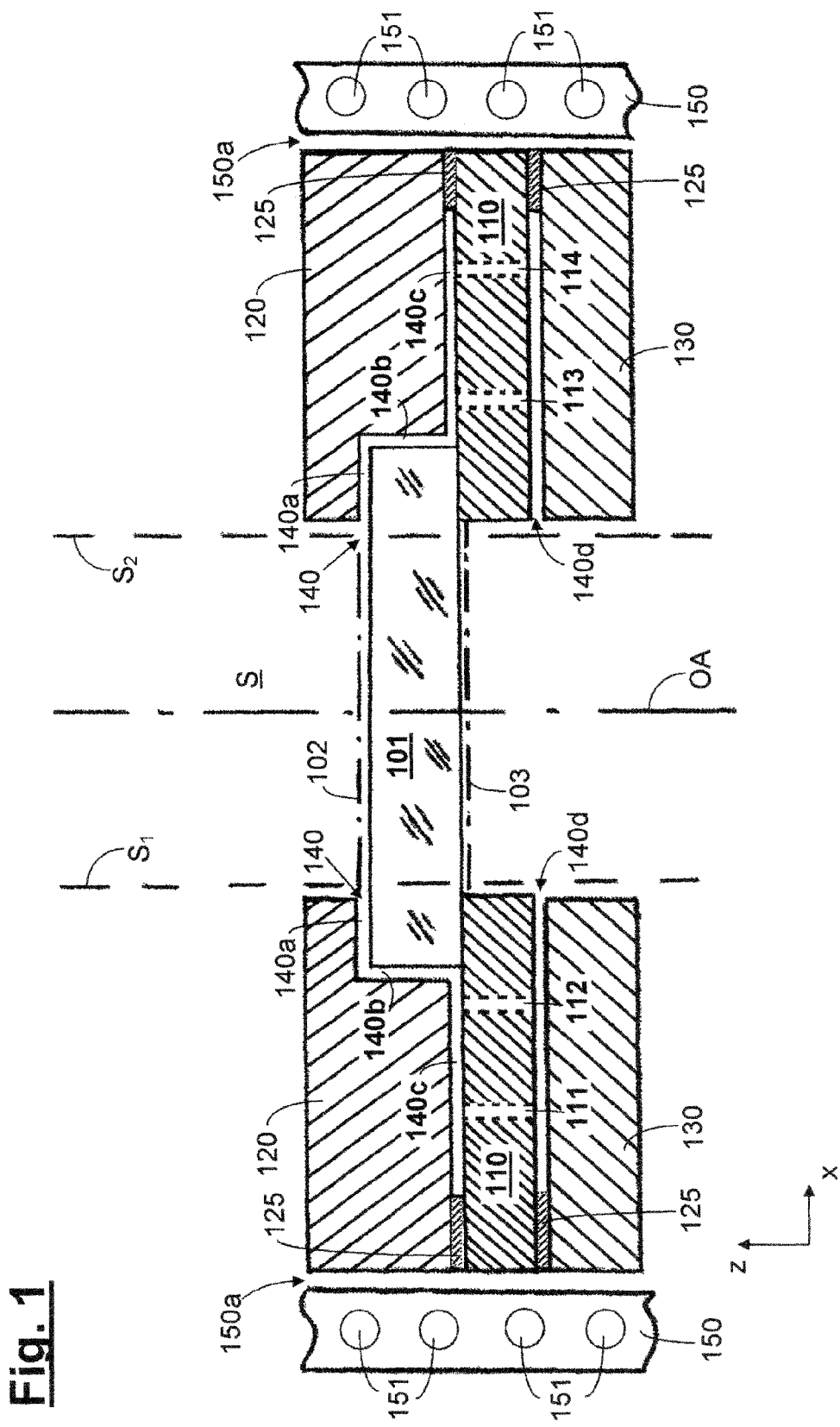
FIG. 1 is a diagrammatic view illustrating the structure of an embodiment of the disclosure.

FIG. 1 shows a view which is only diagrammatic and not true to scale to illustrate a structure according to the disclosure of a first embodiment.

In the arrangement of FIG. 1 an optical element 101 in the form of a lens is held by a holder element 110 and has passing therethrough a light beam S delimited by marginal rays $S_1$ and $S_2$, wherein the direction of light propagation in the coordinate system which is also shown is in the z-direction. Fixing of the optical element 101 to the holder element 110 is not shown in detail for the sake of simplicity of the view and basically can be implemented in any known manner. In addition the holder element 110 in the FIG. 1 embodiment has a multiplicity of openings or slots 111, 112, 113 and 114 which are adapted to receive stress decoupling elements and/or manipulator elements in the holder element 110 and which will be discussed in greater detail hereinafter.

Depending on the respective position in the optical system the optical element 101 can be for example a lens (e.g., a cylindrical lens or a spherical lens) or another transmissive element such as for example a prism or a mirror.

FIG. 1 shows in a dash-dotted line an optical axis OA of the optical system which by definition extends along the center points of curvature of the rotationally symmetrical optical components. Arranged around that optical axis OA extending in the direction of light propagation or the z-direction, in this embodiment, (for example also rotationally symmetrically) is a cooling device 150 in the form of a cooling body having a multiplicity of cooling passages 151 through which a cooling medium circulates in a coolant circuit maintained via a pump (not shown).

The cooling device 150 serves for at least partially dissipating the heat generated within the optical system, in particular within the optical element 101, as a consequence of the light passing through the optical system (and absorbed for example at layers 102, 103 of the optical element 101). In addition the cooling device 150 surrounding the optical system has further advantages for example insofar as the optical system is protected from temperature fluctuations from the outside or from vibration transmitted through the ambient air.

The cooling medium flowing in the cooling passages 151 of the cooling device 150 can be liquid (for example water) or gaseous and is preferably of a constant temperature (for example 22° C.) maintained by external cooling, wherein the respectively appropriate temperature difference is linearly dependent on the spacing of the cooling device 150 relative to those surfaces or components, from which heat is to be dissipated as explained hereinafter.

To implement that heat dissipation effect the optical system according to the disclosure, as an essential element of the disclosure, has at least one heat dissipation element—in the FIG. 1 example there are two heat dissipation elements 120, 130—the function of which is in particular to at least temporarily bridge over the heat conduction section from the optical element 101 to the cooling device 150, insofar as the heat delivered by the optical element 101 to the surrounding gas (air or a flushing gas such as for example nitrogen) is at least partially received or absorbed and is conducted through the material of the heat dissipation element 120, 130 into the region adjoining the cooling device 150.

The FIG. 1 embodiment has two heat dissipation elements 120, 130 of which the heat dissipation element 120, at its radially inward portion, is of a shape corresponding to the optical element 101 insofar as it so-to-speak bears snugly against the optical element 101 except for a preferably constant spacing of also preferably a maximum of 2 mm so that the heat in that region can be effectively transferred by heat conduction from the optical element 101 to the heat dissipation element 120 by way of the remaining gaps 140*a*, 140*b* and making the greatest possible use of the available area or the material of the heat dissipation element 120.

In its radially outward portion the heat dissipation element 120 is also of a constant thickness which is greater relative to the radially inward portion and in that region extends at a gap spacing of preferably also a maximum of 2 mm along the holder element 110 radially outwardly. In that region therefore there can be a transfer of heat from the holder element 110 to the heat dissipation element 120 by way of the flushing gas in the gap 140*c*, for example nitrogen or air, by heat conduction in the z-direction, and that heat can then be dissipated in a direction radially outwardly to the cooling device 150 through the material of the heat dissipation element 120.

As shown in FIG. 1 in addition a second heat dissipation element 130 is arranged on the side of the holder element 110, in opposite relationship to the optical element 101 or the first heat dissipation element 120, and extends at a preferably also constant gap spacing of once again preferably a maximum of 2 mm radially outwardly along the holder element 110 so that heat occurring in the holder element 110 can firstly be transferred by way of the gas in the gap 140*d* (for example air or nitrogen) in a direction along the z-axis and then radially outwardly to the cooling device 150, by heat conduction.

The heat dissipation elements 120, 130 are made from a material of comparatively high specific thermal conductivity, preferably at least 50 W/K·m. A particularly suitable material is aluminum, which is advantageous in particular when the optical system is also constructed from aluminum materials and it is thus possible to achieve adaptation of the respective coefficients of thermal expansion while avoiding the introduction of mechanical stresses.

As shown in FIG. 1 the cooling device 150 is in turn arranged at a (preferably constant) spacing of not more than 5 mm, preferably in the range of between 0.5 mm and 1 mm, from the radially outer end of the first or second heat dissipation element 120, 130 respectively or the holder element 110.

Maintaining a finite spacing or avoiding direct contact with respect to the optical elements or holder elements of the optical system avoids direct or undamped transmission of mechanical vibration from the cooling fluid flow in the cooling device 150 to the optical system. On the other hand, the implementation of an at least substantially uniform spacing (for example up to fluctuations in spacing of ±10%, preferably ±5%) relative to the heat dissipation element 120 or 130 prevents irregular cooling and the concomitant introduction of stresses into the optical system or deformation of the optical elements or holder elements, to the extent of bending of the optical system and adverse influence linked thereto on the optical properties.

The holder element 110 and the heat dissipation element or elements 120 or 130 can have at least one contact region 125 as can also be seen from FIG. 1 so that the sealing integrity achieved in that way for the gas volume in the radially inward gaps 140*a-c* ensures gas-tight sealing integrity of the system or the optical module accommodating the optical element 101 with the associated holder element 110. As shown in FIG. 1 that contact region 125 is outside the slots 111-114 in a radial direction with respect to the optical axis OA so that stress decoupling achieved for example by those slots 111-114 is not impeded by the contact region 125 with the heat dissipation element 120 or 130.

In a further embodiment the cooling device 150 can also be designed to be adjustable in relation to the optical system so that then the width of the gap 150*a* can be suitably adapted.

To ensure the function according to the disclosure of the heat dissipation element or elements 120, 130, besides the above-described small spacings from the respective optical element 101 or the holder element 110, on the one hand, and the cooling device 150 on the other hand, it is important for the geometrical arrangement in the optical system to be suitably selected in order to bridge over any regions of increased thermal resistance.

Such regions involving an increased thermal resistance are represented in FIG. 1 in particular by the above-mentioned slots 111, 112, 113 and 114 which serve for the fitment of solid-body joints or manipulators (for example x-y-manipulators). As the air gaps (or regions filled with flushing gas) for example occurring in those slots 111-114 each represent resistances in regard to heat conduction, it is particularly advantageous in the FIG. 1 arrangement that the second heat dissipation element 130 like also the first heat dissipation element 120 respectively extends in a direction radially inwardly over the region of the respective slots 111-114, whereby effective heat dissipation can be effected with at least substantially by-passing of the slots 111-114 by way of the first and second heat dissipation elements 120, 130 in a direction which is radial relative to the optical axis OA.

Such at least substantial by-passing of the holder elements 110 with the heat dissipation according to the disclosure towards the cooling device 150 is advantageous or appropriate not only when the above-described slots 111-114 are present, but also in situations in which the holder element 110 itself is made from a material with a comparatively low coefficient of thermal conduction (for example steel to achieve a high level of stiffness or a high natural frequency or Invar for ensuring sufficient positional stability).

In addition there can also be regions of increased thermal resistance insofar as the hold for the optical element 101 at the holder element 110 is often not over a relatively large area—as shown in simplified form in FIG. 1—but by way of (typically three) comparatively small support points. The additional heat barriers thereby produced in that region can also be advantageously bridged by the heat dissipation effect according to the disclosure.

In a further configuration the holder element 110 is at least region-wise of a strongly reflecting nature (for example by the application of an HR layer) to avoid the holder element being additionally heated by stray light. Furthermore in addition or alternatively the heat dissipation element or elements can be entirely or partially provided with an absorbent coating (AR layer) in order that stray light is targetedly captured in those regions via high absorption and the heat generated thereby is also dissipated in a particularly effective fashion to the cooling device 150 by way of the respective heat dissipation element 120, 130.

In a further embodiment (not shown) one or more heat dissipation elements can be integrated into an adjacent holder element.

FIG. 2a shows a diagrammatic view to describe a further embodiment of the disclosure, wherein in comparison with FIG. 1 elements which are comparable or have the same action are identified by references increased by "100". The embodiment of FIG. 2a differs from that in FIG. 1 insofar as here there is only one heat dissipation element 220, while in addition the holder element 210 does not have any slots or heat barriers linked thereto. Thus here as described hereinbefore it is optionally possible to dispense with a further heat dissipation element. It will be appreciated that in this case also the arrangement of a second heat dissipation element is possible similarly to FIG. 1 and in particular—as stated hereinbefore—for example when the holder element 210 is made from a material with a low coefficient of thermal conduction. In addition the holder element itself can be in the form of a heat dissipation element.

Figure 2B:
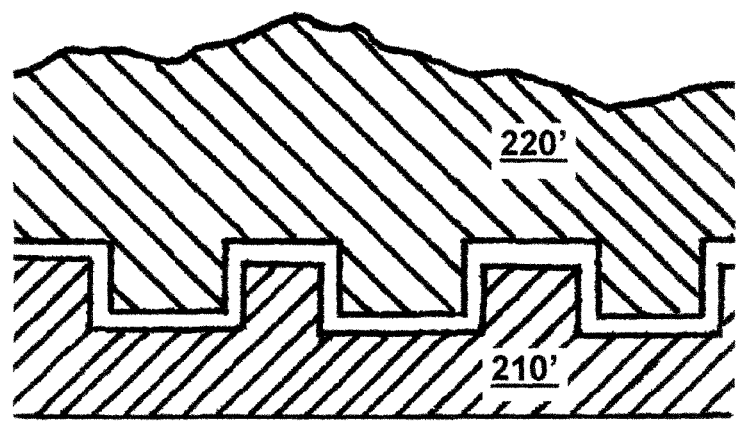

As shown in FIG. 2b via an indicated further embodiment, (at least) one holder element 210' and (at least) one heat dissipation element 220' can also be indented into each other to increase the surface areas contributing to heat dissipation, or can have mutually corresponding surfaces with successive relative raised portions and depressions (which as shown in FIG. 2b is also effected in contactless relationship or while maintaining a gap spacing).

Figure 3:
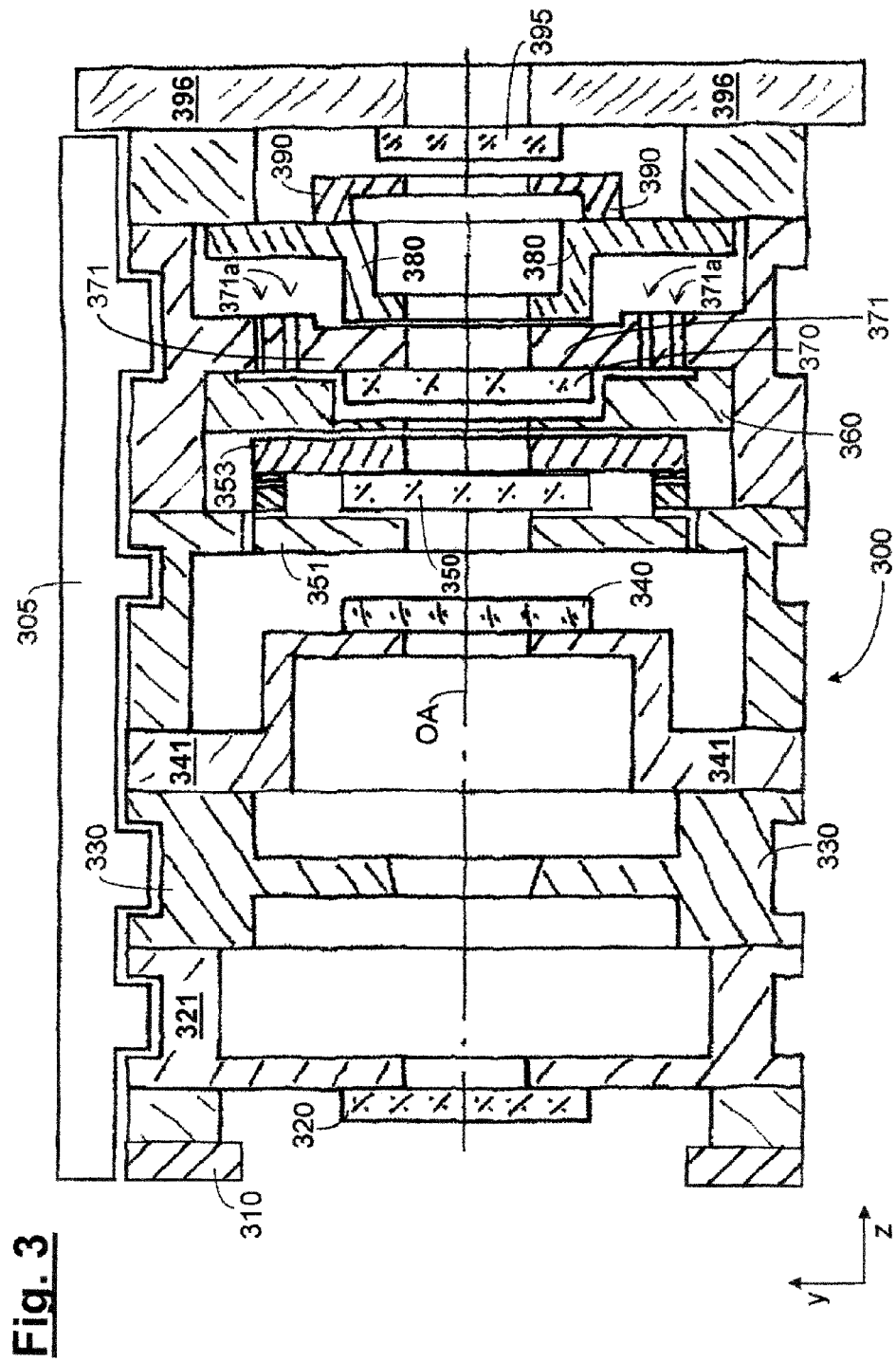
FIG. 3 is a diagrammatic view of an illumination system as an example of use of the disclosure.

FIG. 3 shows a diagrammatic view of an illumination system 300 in which the disclosure is embodied.

The illumination system 300 which is only shown in simplified form serves for mixing light of a laser light source (not shown in FIG. 3) as homogenously as possible and in the direction of light propagation (extending in the z-direction in the illustrated coordinate system) has in succession after a ring 310 delimiting the light entry, a first lens 320 with associated holder element 321 and a first stray light aperture member 330. The stray light aperture member 330 serves for targetedly catching stray light and for that purpose has a surface treatment providing for good absorption. In addition the stray light aperture member 330 is disposed at a position where it is comparatively far away from the holder elements next in the beam path, so that as little heat as possible is transferred to those holder elements by thermal conduction in the flushing gas within the illumination system 300. The stray light aperture member 330 also has relatively large cross-sectional areas so that heat present is quickly transmitted to the outer portion of the system.

The first stray light aperture member 330 is followed in the beam path by a second lens 340 with associated holder element 341, and a third lens 350 with associated holder element 353. Arranged adjacent to the third lens 350 are heat dissipation elements 351 and 360 according to the disclosure, which can be designed in accordance with the above-described embodiments.

Disposed following in the beam path or downstream of the heat dissipation element 360 is a fourth lens 370 with associated holder element 371, with which there is associated a further heat dissipation element 380 according to the disclosure which can also be designed in accordance with the above-described embodiments. As shown in FIG. 3 the holder element 371 has openings or slots 371a which represent heat barriers impeding heat dissipation by way of the holder element 371 itself so that here the heat dissipation element 380 is particularly effective as already described above.

Following downstream in the beam path are a second stray light aperture member 390 and a fifth lens 395 carried by an associated holder element 396.

In the example of use in FIG. 3 the heat dissipation elements 351, 360 and 380 are used in the immediate proximity of or adjacent to the lenses 350, 370 and the associated holder elements 353, 371 respectively so that the flow of heat is not impeded for example by thin limbs of manipulators and the heat barriers formed thereby. Rather the heat is transmitted by way of the thin air or gas gap respectively present between the heat dissipation element and the lens or holder element, into the material, which is a good conductor of heat, of the heat dissipation elements 351, 360 and 380, and is there transported directly or over a short distance to the outer portion of the system or the cooling device 305 disposed there. The illumination system 300 is only shown in simplified form and can have further elements contributing in particular to homogenous light mixing.

Figure 4:
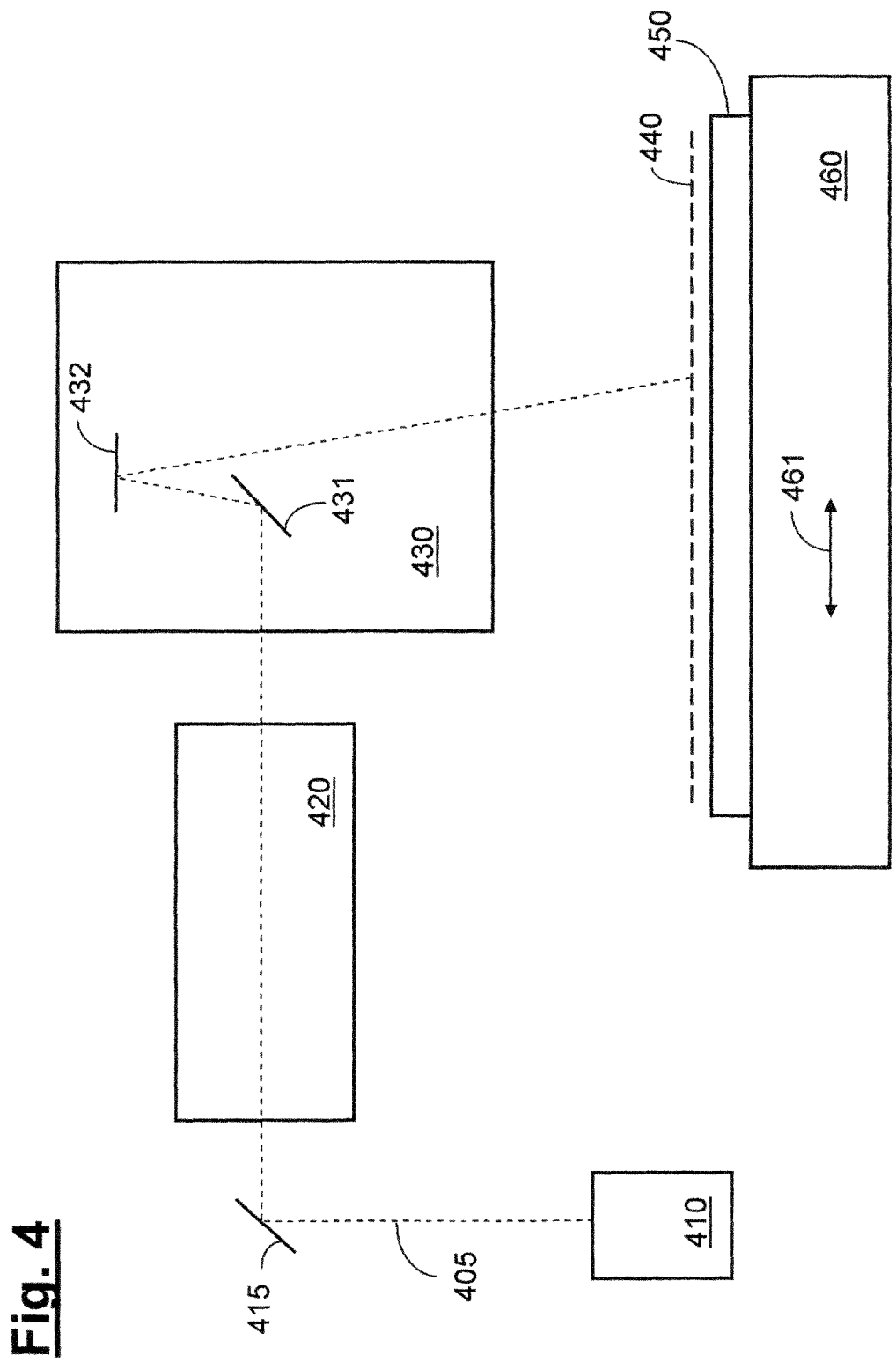
FIG. 4 is a diagrammatic view of an apparatus for laser crystallization as a use by way of example of the disclosure.

FIG. 4 shows an only diagrammatic view as a generic system of an apparatus for laser material processing, in particular for laser crystallization or laser hardening. Besides the use for laser crystallization (for example in the known ELA methods, SLS methods, TDX methods and ZMR methods) or laser hardening, the disclosure can also be applied in apparatuses for and methods of laser doping (that is to say activation of dopants in semiconductors), laser cutting or laser welding and further apparatuses for and methods of laser material processing.

In addition to an illumination system 420 (which is only indicated and which in particular can involve the structure described with reference to FIG. 3) the apparatus in FIG. 4 has a projection optical module (POM) 430.

As shown in FIG. 4 a laser beam 405 produced by a laser light source 410 is firstly deflected by way of a deflection mirror 415 and passes through the illumination system 420 in which the laser beam 405 is homogenously mixed without a substantial change in its cross-section. The projection optical module 430 has a multiplicity of mirrors (of which two mirrors 431 and 432 are indicated only by way of example in FIG. 4) which convert the laser beam 405 which is incident from the illumination system 420 in a still almost square cross-section into a substantially line-shaped cross-section. The laser beam converted in that way, in the example of use involving laser crystallization, then impinges for example on a silicon (Si) layer 440 on a substrate 450, which for example can involve a panel which serve for the production of semiconductor displays and which is used in electronic devices of differing kinds (such as flat screen televisions or cellular telephone displays). The substrate 450 is displaceable for the laser crystallization operation by way of movable carrier 460 transversely to the direction of the laser beam 405 (in the direction of the double-headed arrow 461).

While the disclosure has been described by reference to specific embodiments, numerous variations and alternative embodiments will be apparent to a person skilled in the art, such as, for example, by combination and/or exchange of features of individual embodiments. Accordingly, it will be appreciated by a person skilled in the art that such variations and alternative embodiments are also embraced by the present disclosure and the scope of the disclosure is limited only in the sense of the accompanying claims and equivalents thereof.

What is claimed is:

1. An optical system, comprising:
   an optical arrangement, comprising:
      an optical element;
      a holder element holding the optical element; and
      a heat dissipation element configured to at least partially dissipate thermal energy generated in the optical element to outside the optical system during use of the optical system,
   wherein:
      the heat dissipation element is arranged without direct contact with the optical element;
      the heat dissipation element is in direct contact with the holder element;
      the holder element comprises a heat barrier;
      the heat barrier is not in direct contact with the optical element; and
      the heat dissipation element extends over the heat barrier.

2. The optical system of claim 1, wherein the holder element has first and second regions, the second region being arranged in a radial direction outside the first region in relation to an optical axis of the optical system, and the heat dissipation element being in contact with the holder element only in the second region of the holder element.

3. The optical system of claim 1, wherein the heat dissipation element has a light passage opening, an area of the light passage opening being not more than 200% of a cross-sectional area of a light beam passing through the optical element during operation of the optical system.

4. The optical system of claim 1, wherein the optical arrangement is configured so that heat conduction from the optical element and/or the holder element to the heat dissipation element is effected in at least one region in a direction which extends at least approximately perpendicular to a surface of the optical element and/or a surface of the holder element.

5. The optical system of claim 1, wherein the heat dissipation element is outside an optically used region of the optical system.

6. The optical system of claim 1, wherein the heat dissipation element does not disturb passage of light through the optical system during use of the optical system.

7. The optical system of claim 1, further comprising at least two heat dissipation elements.

8. The optical system of claim 7, wherein the heat dissipation elements are disposed on mutually opposite sides of the holder element.

9. The optical system of claim 1, wherein the heat dissipation element is configured to absorb at least a portion of thermal energy generated by light during use of the optical system.

10. The optical system of claim 1, wherein the heat dissipation element comprises a material having a specific thermal conductivity of at least 50 W/K·m.

11. The optical system of claim 1, wherein at least one region of the heat dissipation element is a distance of not more than 2 mm from the optical element and/or the holder element.

12. The optical system of claim 11, wherein the distance is substantially constant.

13. The optical system of claim 1, wherein the heat dissipation element has a geometry corresponding to the optical element and/or the holder element.

14. The optical system of claim 1, wherein at least one region of the optical element and/or the holder element is indented with the heat dissipation element.

15. The optical system of claim 1, wherein at least one region of the heat dissipation element is in the form of a plate or a sheet.

16. The optical system of claim 1, wherein the holder element further comprises a highly reflecting layer.

17. The optical system of claim 1, wherein the heat dissipation element further comprises an absorbing layer.

18. The optical system of claim 1, wherein the optical system is configured so that, during operation of the optical system, laser light having an energy of at least 300 watts can pass therethrough.

19. The optical system of claim 1, wherein the heat barrier is a slot.

20. The optical system of claim 1, wherein the heat barrier comprises a material with a comparatively low coefficient of thermal conduction.

21. The optical system of claim 1, wherein the holder element comprises at least one solid-body joint or a manipulator.

22. The optical system of claim 1, wherein the optical system is configured so that thermal energy generated in the optical element is dissipated to an external cooling device.

23. The optical system of claim 1, wherein the optical system is an illumination system.

24. The optical system of claim 1, wherein the optical system is an illumination system configured to homogenize laser light over a cross-section of the laser light.

25. An apparatus, comprising:
   the optical system of claim 1,
   wherein the apparatus is configured for laser material processing.

26. The optical system of claim 1, wherein the holder element comprises first and second heat barriers, the first heat barrier disposed a first distance from the optical element along a radial direction, the second heat barrier disposed a second distance from the optical element along the radial direction, and the second distance is greater than first distance.

27. The optical system of claim 1, wherein a portion of the holder element is between the optical element and the heat barrier.

28. The optical system of claim 1, wherein the optical element has an outer perimeter, and the heat barrier is disposed outside the outer perimeter of the optical element in a radial direction.

* * * * *